United States Patent [19]
Kubota

[11] Patent Number: 5,950,802
[45] Date of Patent: Sep. 14, 1999

[54] IC PACKAGE TRANSFER AND RELOCATION MECHANISM

[75] Inventor: Toshihiro Kubota, Honjo, Japan

[73] Assignee: Hitachi Electronics Engineering Co., Ltd., Tokyo, Japan

[21] Appl. No.: 08/699,343

[22] Filed: Aug. 19, 1996

[30] Foreign Application Priority Data

Dec. 4, 1995 [JP] Japan .................................. 7-337668

[51] Int. Cl.$^6$ .................................................. B65G 25/00
[52] U.S. Cl. ........................................ 198/468.3; 294/87.1
[58] Field of Search ........................... 198/468.3, 468.4; 414/792; 294/65, 87.1

[56] References Cited

U.S. PATENT DOCUMENTS

| | | | |
|---|---|---|---|
| 3,542,412 | 11/1970 | Koch et al. | 294/65 |
| 4,061,528 | 12/1977 | Lingl | 198/468.3 |
| 4,425,074 | 1/1984 | Becker et al. | 198/468.3 |
| 4,832,180 | 5/1989 | Ferrero | 198/468.3 |
| 5,177,434 | 1/1993 | Suzuki et al. | 198/468.3 |
| 5,575,376 | 11/1996 | Colamussi | 198/468.3 |

FOREIGN PATENT DOCUMENTS

| | | |
|---|---|---|
| 0433876A1 | 6/1991 | European Pat. Off. . |
| 4211533A1 | 10/1993 | Germany . |

*Primary Examiner*—Joseph E. Valenza
*Attorney, Agent, or Firm*—Oblon, Spivak, McClelland, Maier & Neustadt, P.C.

[57] ABSTRACT

A transfer mechanism for transferring molded IC device packages or the like between different types of trays which have IC package holder nests in differently spaced arrays. The transfer mechanism includes a suction gripper assembly supported on a horizontally and vertically movable robot arm, and having four suction heads mounted separately on four support blocks on a mounting plate. The four support blocks consist of a first support block fixed in a predetermined reference position on the mounting plate, second and third support blocks movably supported on the mounting plate for movements toward and away from the first support block in perpendicularly intersecting directions, and a fourth support block movably supported on the mounting plate for movements toward and away from the first support block in a diagonal direction following movement of at least one of the second and third support blocks.

9 Claims, 10 Drawing Sheets

IC PACKAGE TRANSFER AND RELOCATION MECHANISM

BACKGROUND OF THE INVENTION

1. Field of the Art

This invention relates to an IC package transfer and relocation mechanism particularly suitable for use on an IC package fabrication line or on an IC package inspection line for the purpose of transferring and relocating a large number of IC device packages between different types of IC holder trays.

2. Prior Art

There are a great variety of molded packages of IC devices (hereinafter referred to as "IC devices" or "IC packages" for brevity), which can be classified, for example, into a pin insertion type and a flat mount type according to the shape of lead pins which are led out of a molded package body. In the case of the pin insertion type IC packages, the lead pins which are led out on the opposite lateral sides of a package body are bent downward for insertion into through holes provided on a circuit board. In handling IC packages of this type, it is the general practice to use magazines which are adapted to accommodate a plural number of IC packages in a row within a tubular housing.

On the other hand, in the case of the flat mount type IC packages including SOP (Small Outline Package) and QFP (Quad Flat Package), the lead pins which are led out on the opposite two sides or on the four sides of a package body are once bent downward in middle portions and then bent again in lateral directions at a level slightly lower than the bottom surface of the package body. In some cases, the lead pins which are led out on the two or four sides of a package body are turned inward toward the bottom side of the package as with SOJ (Small Outlined J-bend Package) or PLCC (Plastic Leaded Chip Carrier). These flat mount type IC packages are designed to be mounted in position on a circuit board by soldering, and are recently used increasingly as devices which can contribute to reductions in thickness and size of circuit boards.

In contrast to the pin insertion type IC packages which can be accommodated in a cylindrical magazine, it has been the general practice to use flat trays as a jig in transferring flat mount type devices. The trays of this sort are usually in the form of a rectangular flat plate which is formed with a large number of recessed IC holder nests in an array with predetermined spacings between adjacent IC holder nests. Each IC holder nest is formed in a depth which is greater than the height of a nesting IC device from its lead pins to the top side of its package body, so that a number of loaded trays can be conveniently stacked one on another when in storage or at the time of transportation. The respective holder nests on a tray are open on the upper side, permitting easy access to IC devices by a handling means such as a suction or vacuum gripper or the like.

In a stage of quality control prior to shipment, it is usually the case that manufactured IC device packages are tested by measurements of electrical characteristics. The test of this nature is conducted on an IC tester which is provided with a number of contacts to be connected to the lead pins of IC devices. In order to carry out this inspectional test efficiently, a plural number of similar IC packages are tested simultaneously on an IC tester by the use of a tester tray which is arranged to hold a plural number of IC devices in predetermined arrayed positions, more particularly, by bringing a large number of sets of contacts on a tester head into engagement with lead pins of the respective IC packages which are held in predetermined positions on the tester tray relative to the tester head.

Generally, trays which are used for the purpose of storage or transportation of IC packages, (hereinafter referred to simply as "storage tray" for brevity), are arranged to hold as many IC packages as possible in a relatively highly packed state. In contrast, the tester trays are required to hold IC packages in relatively widely spaced positions because of the need for providing spaces, on the part of tester trays, for clamp mechanisms which hold the respective IC packages accurately in position on the tester trays, along with alignment mechanisms for bringing the tester contacts and lead pins into alignment with each other.

Therefore, prior to a product test, a storage tray which holds a plural number of IC packages is placed on a loader to transfer the respective IC packages onto a tester tray, and, after finishing a test, the tested IC packages are unloaded from the tester tray and placed again on a storage tray in classified sections, i.e., either in a acceptable section or a defective quality section, according to test results. For this purpose, a robot machine with a suction gripper is provided at the testing station to eject tested IC device packages from a tester tray and transfer and relocate the same onto a storage tray accordingly.

The storage and tester trays are provided with recessed IC package holder nests in arrays of different pitches or with different spacings for the reasons as explained above, necessitating to transfer and relocate the tested IC devices one by one from a storage tray to a tester tray despite low IC transfer speed and efficiency. In some cases, these problems arising from the difference in pitch of arrayed IC package holder nests between the two types of trays are coped with by using a pair of suction grippers which are movable toward and away from each other in such a way as to compensate for the difference in pitch of arrayed IC package holder nests on the two trays. Namely, at the time of transferring IC packages to or from a storage tray, the interval between the two suction grippers is narrowed into conformity with the pitch of an array of IC holder nests on the storage tray, and, at the time of transferring IC packages to or from a tester tray, the interval between the two suction grippers is broadened into conformity with the pitch of an array of IC holder nests on the tester tray.

Recently, reductions of testing time have been achieved to some extent by introduction of IC testers of higher performance quality. Nonetheless, higher efficiency and speeding of inspections by IC testers cannot be attained without an IC transfer and relocation mechanism which is capable of transferring IC device packages between a storage tray and a tester tray efficiently in shortened time periods. Therefore, an improvement in transfer speed of IC packages has a great importance from the standpoint of enhancing efficiency and speeding the inspections by IC testers.

SUMMARY OF THE INVENTION

With foregoing situations in view, it is an object of the present invention to provide an IC package transfer and relocation mechanism which is capable of transferring molded packages of IC devices or the like efficiently at an increased speed between two different types of IC holder trays with IC package holder nests in arrays of different pitches or spacings.

In accordance with the present invention, the above-stated objective is achieved by the provision of an IC package transfer and relocation mechanism for transferring molded IC packages or the like to and from a first tray having thereon a plural number of IC package holder nests in a relatively narrowly spaced array and a second tray having thereon a plural number of IC package holder nests in a relatively widely spaced array, the transfer and relocation mechanism comprising: a suction gripper assembly supported on a horizontally and vertically movable robot arm, and having four suction heads mounted separately on four support blocks on a mounting plate; the four support blocks including a first support block fixed in a predetermined reference position on the mounting plate, second and third support blocks movably supported on the mounting plate for movements toward and away from the first support block in two perpendicularly intersecting directions, and a fourth support block movably supported on the mounting plate and arranged to be moved toward and away from the first support block in a diagonal direction following movement of at least one of the second and third support blocks.

In a preferred form of the invention, the fourth support block is slidably supported on guide rods extended out from the second and third support blocks in directions perpendicular to the directions of movements of the second and third support members. Further, the first support block is fixedly mounted on the mounting plate in a corner portion defined between a couple of vertical guide walls of the mounting plate joined at right angles with each other, and the second and third support blocks are driven from drive means to shift the respective positions toward and away from the first support block along surfaces of the vertical guide walls, simultaneously shifting the position of the fourth support block along guide rods projecting from the second and third support blocks in perpendicularly intersecting directions.

BRIEF DESCRIPTION OF THE DRAWINGS

The above and other objects, features and advantages of the invention will become apparent from the following particular description of the invention, taken in conjunction with the accompanying drawings which show by way of example preferred embodiments of the invention, and in which.

PARTICULAR DESCRIPTION OF THE INVENTION

In the following description of preferred embodiments, the IC transfer and relocation mechanism according to the invention is applied as means for transferring and relocating SOP type molded IC device packages between a storage tray and a tester tray of an IC tester for testing electrical characteristics of the respective IC packages. However, it is to be understood that, in addition to IC package testers, the IC package transfer and relocation mechanism of the invention can find various applications which involve transfer of IC devices or similar articles.

Figure 1:
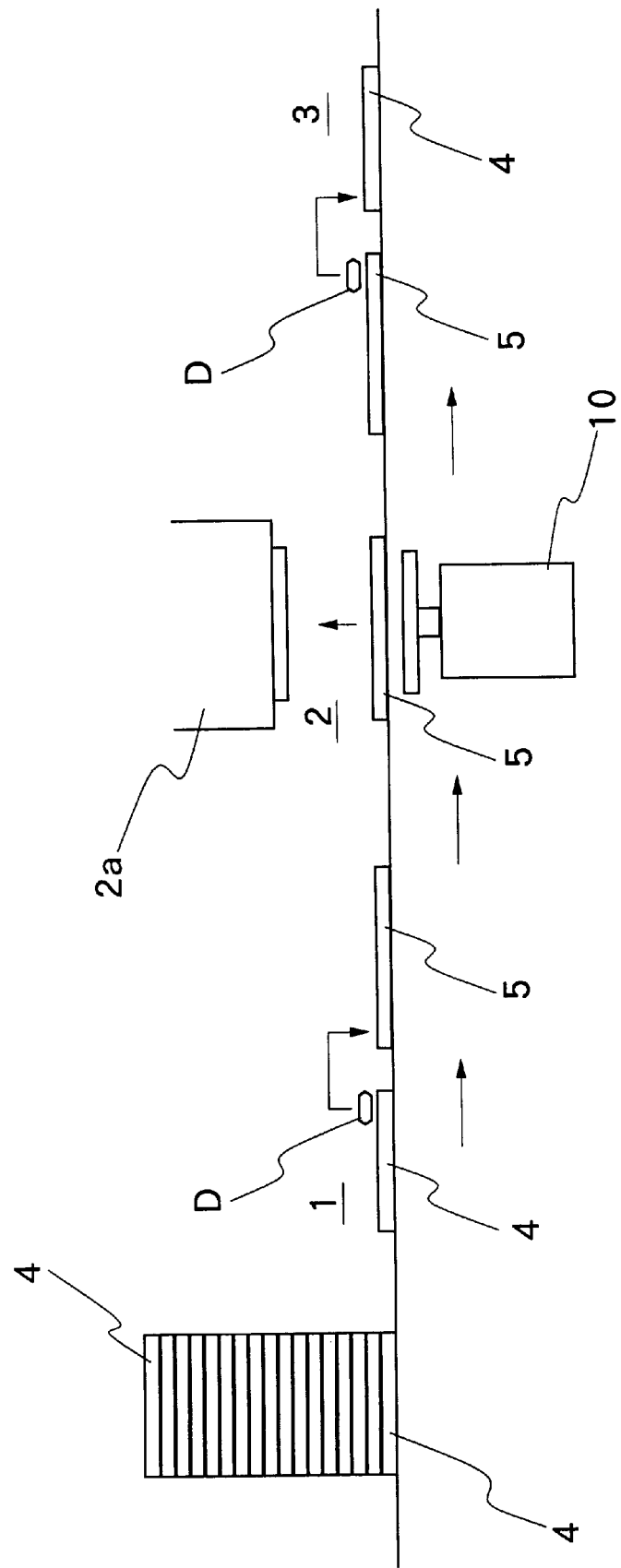
FIG. 1 is a schematic illustration showing the general layout of an IC tester for testing electrical characteristics of molded IC packages.
Figure 2:
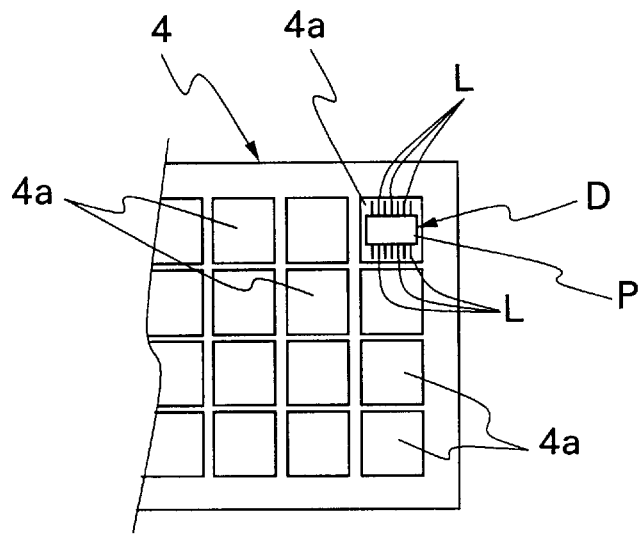
FIG. 2 shows at (a) and (b) a storage tray and a tester tray respectively in partly cutaway schematic plan views.
Figure 2:
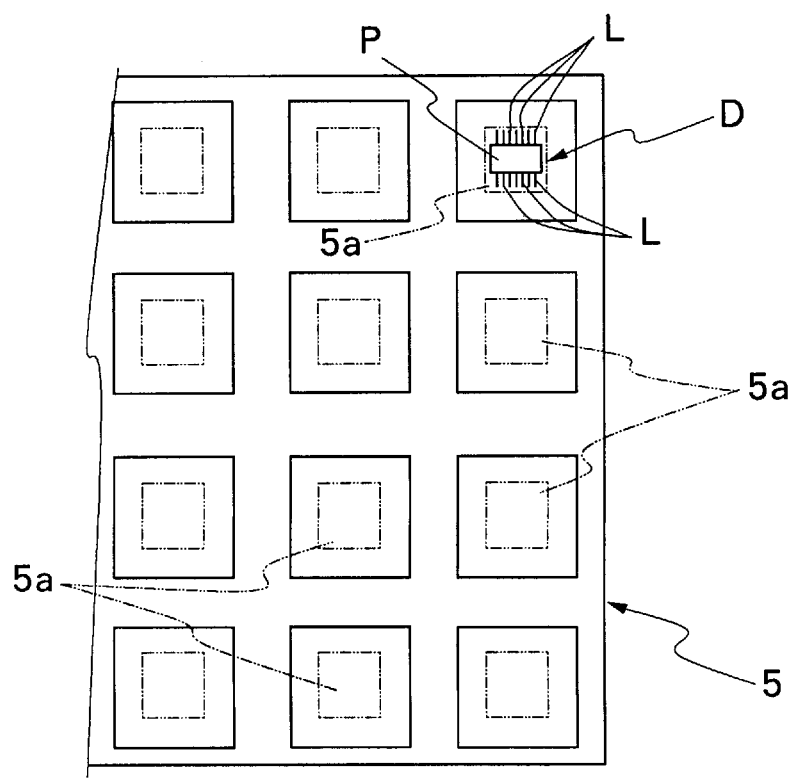
Figure 3:
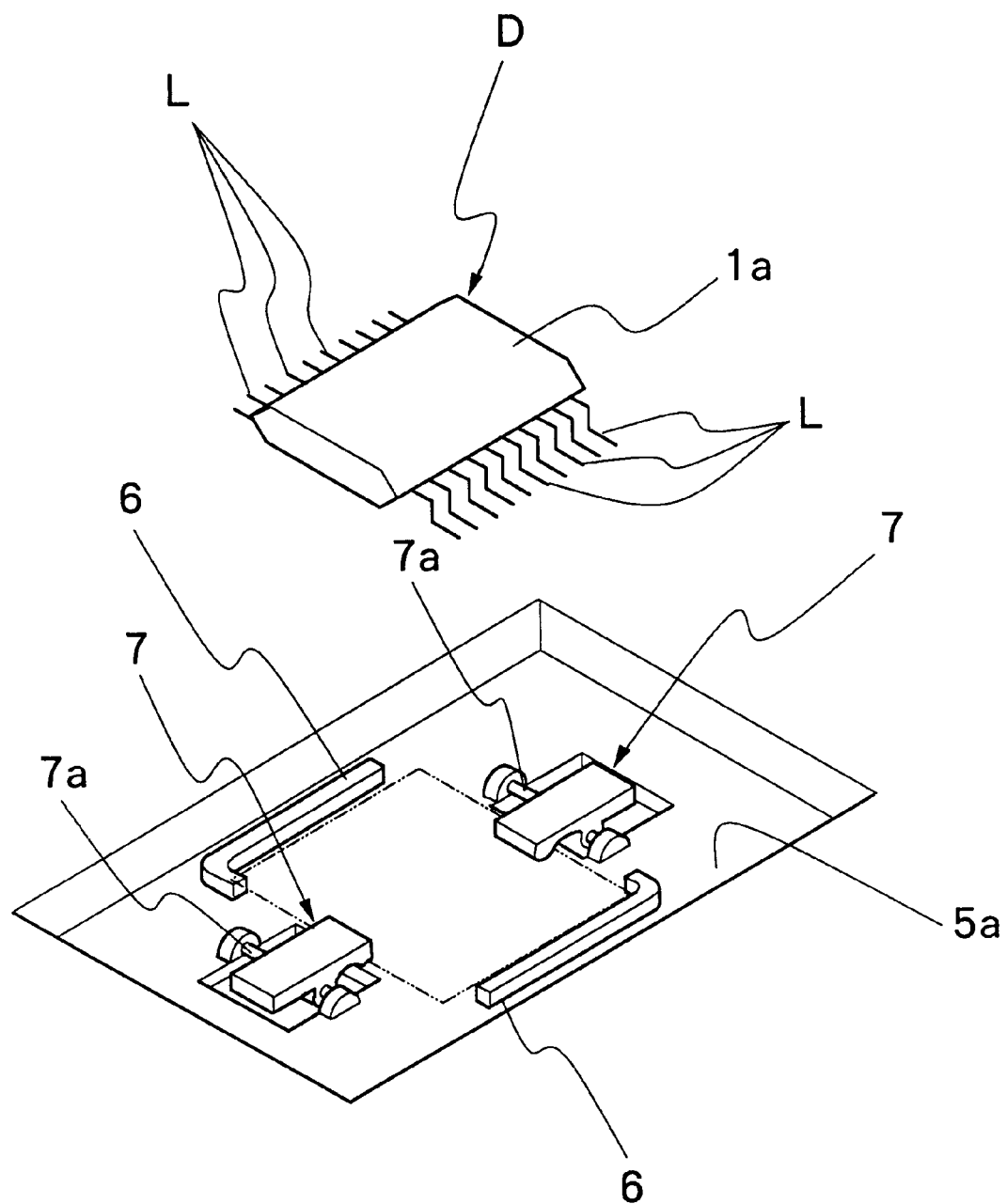
FIG. 3 is a schematic illustration of the construction of an IC holder nest on the tester tray.
Figure 4:
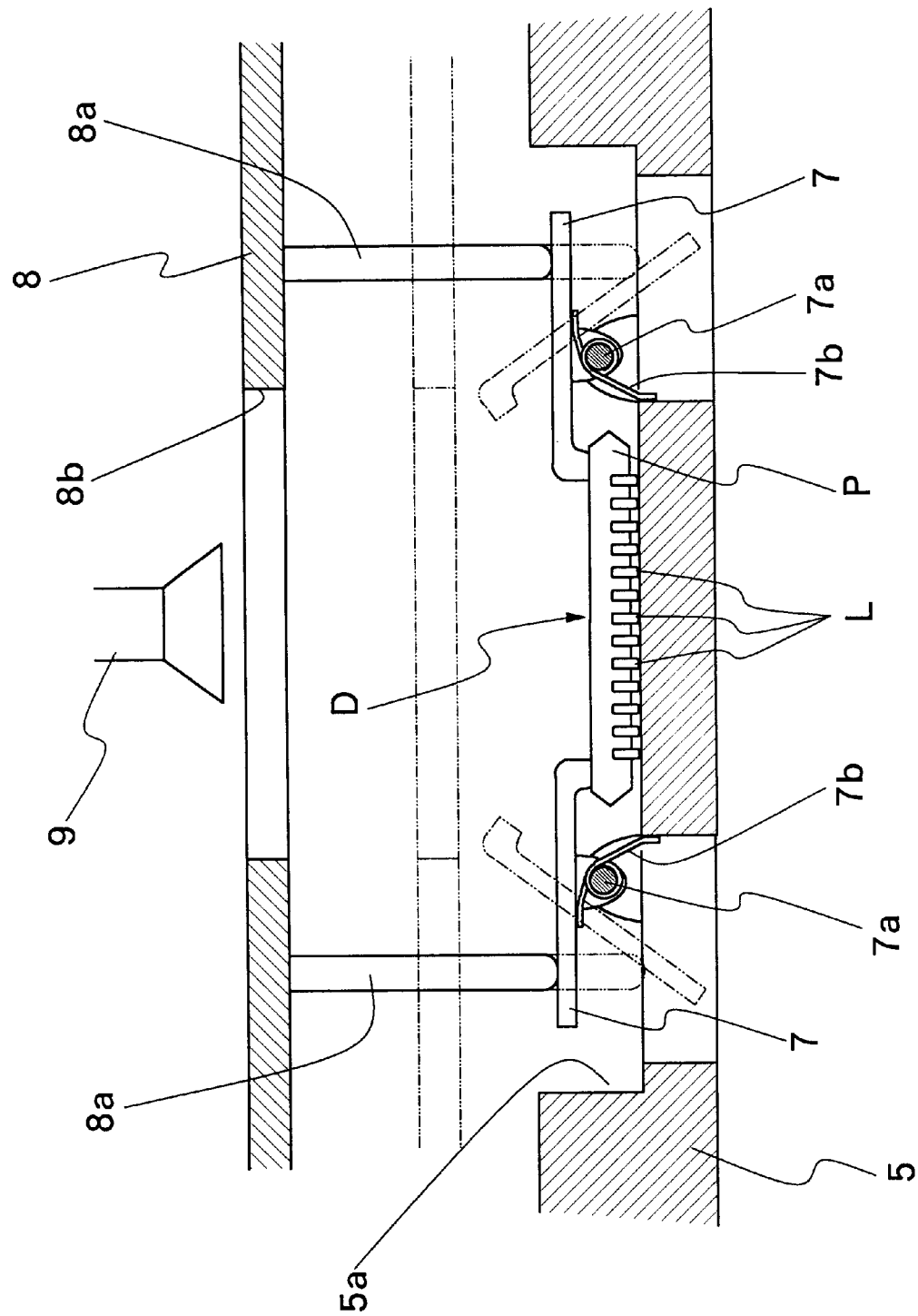
FIG. 4 is a schematic illustration explanatory of operations by a suction head of a suction gripper assembly in placing a molded IC device package in or off an IC holder nest on the tester tray.

Referring to FIG. 1, indicated at 1 is a loader section, at 2 a testing section and at 3 an unloader section of an IC tester machine. Stacked in the loader section 1 are a large number of storage trays 4 which each hold a large number of molded IC devices or packages D. As shown in FIGS. 2 to 4, the IC packages D in this particular embodiment are of the SOP type having a large number of lead pins L led out on the opposite lateral sides of a molded package casing P. Each of the lead pins L is once bent downward substantially in a middle portion and then bent again flatly in a lateral direction at a level lower than the bottom surface of the molded package casing P. It is these outer bent portions of lead pins L that are soldered to a circuit board when mounting the IC package D on the latter.

The stacked storage trays 4 in the loader section 1 are set in a transfer position one after another to hand over IC packages D to a tester tray 5. A tester tray 5 loaded with a predetermined number of IC packages D is advanced to the testing section 2 and stopped at a predetermined position under a tester head 2a. Upon reaching that position, the tester tray 5 is pushed up toward the tester head 2a by operation of a tray lifting drive means 10, thereby to make electrical connections between the respective IC packages D on the tray 5 and the tester head 2a to test their electrical properties. Upon finishing a predetermined test, the tester tray 5 is lowered and transferred to the unloader section 3 to unload the tested IC packages D before being returned to the loader section 1.

Located in the unloader section 3 are storage trays 4, which are similar in construction to the storage trays 4 in the loader section 1, for receiving tested IC packages D from the tester tray 5. In order to transfer acceptable IC packages separately from defective IC packages according to test results, a couple of storage trays 4 may be set in predetermined positions in the unloading section 3. Alternatively, acceptable and defective IC packages may be transferred onto one storage tray in case measurement data of tested IC packages are recorded in relation with positions of IC package holder nests of the storage tray.

As shown particularly in FIGS. 2(a) and 2(b), both of the storage and tester trays 4 and 5 are basically in the form of a thin flat plate having a large number of recessed IC package holder nests 4a or 5a arranged in an array of a predetermined pitch or with predetermined spacings between rows and columns.

More specifically, the storage tray 4 shown at (a) of FIG. 2 is arranged in a compact form and provided with an array of IC package holder nests 4a which are each dimensioned only slightly larger than the outer shape of an IC package D for the purpose of accommodating as many IC packages as possible within a limited area. Namely, in the case of the storage tray 4, the IC package holder nests 4a in the respective rows and columns are positioned in closely spaced relations with each other. Since the IC package holder nests 4a on the storage tray 4 are formed in a shape which just fits the outer shape of the IC package, they can retain the respective IC packages D in position in an immobilized state.

On the other hand, as shown in FIGS. 3 and 4, the tester tray 5 needs to be able to hold the respective IC packages D in position in a stabilized state within the IC package holder nests 5a with strict accuracy relative to the tester head 2a. In this regard, in order to position and hold the lead pins L of IC packages D accurately within the respective IC holder nest 5a, the tester tray 5 is provided with positioning protuberances 6 in each IC package holder nest 5a to demarcate the positions of laterally turned outer ends of the lead pins L and of outer flanks of lead pins L in diagonally opposite end positions of the IC package P by abutting engagement therewith. Further, for the purpose of retaining the IC packages in position in a stabilized state, each IC package holder nest 5a is provided with clamp members 7 which serve to grip opposite end portions of the molded package casing P. Because of the necessity for providing these positioning and clamping mechanisms for the IC packages D, the IC package holder nests 5a on the tester tray 5 are formed in a larger size with a greater open area as compared with an area which is occupied by an IC package D (indicated by an imaginary line in FIG. 3).

Each one of the above-mentioned clamp members 7 is rockable up and down about a pin 7a, and constantly urged toward a predetermined clamping position under the influence of a biasing action of a spring 7b which is provided on the pin 7a. When pushed down against the biasing action of the spring 7b, the clamp member 7 is turned into a releasing position to release an IC package D in an IC package holder nest 5a. The respective clamp members 7 need to be turned into the release positions each time when IC packages D are transferred to or from the IC package holder nests 5a on the tester tray 5. For this purpose, as illustrated in FIG. 4, the clamp members 7 in each IC package holder nest 5a are associated with push rods 8a on the lower side of a clamp operating plate 8 which is vertically movable toward and away from the tester tray 5 through operation of a lift cylinder or other lift drive mechanism, which is not shown. The clamp operating plate 8 is provided with an opening 8b over each IC package holder nest 5a, so that, when the clamp operating plate 8 is moved downward or toward the tester tray 5, the clamp members 7 are pushed and turned into releasing positions by the push rods 8a to put the IC holder nest 5a in a released state. Consequently, in this state, an IC package D can be placed in the IC holder nest 5a by means of a suction gripper 9 or the like through the opening 8b.

Figure 5:
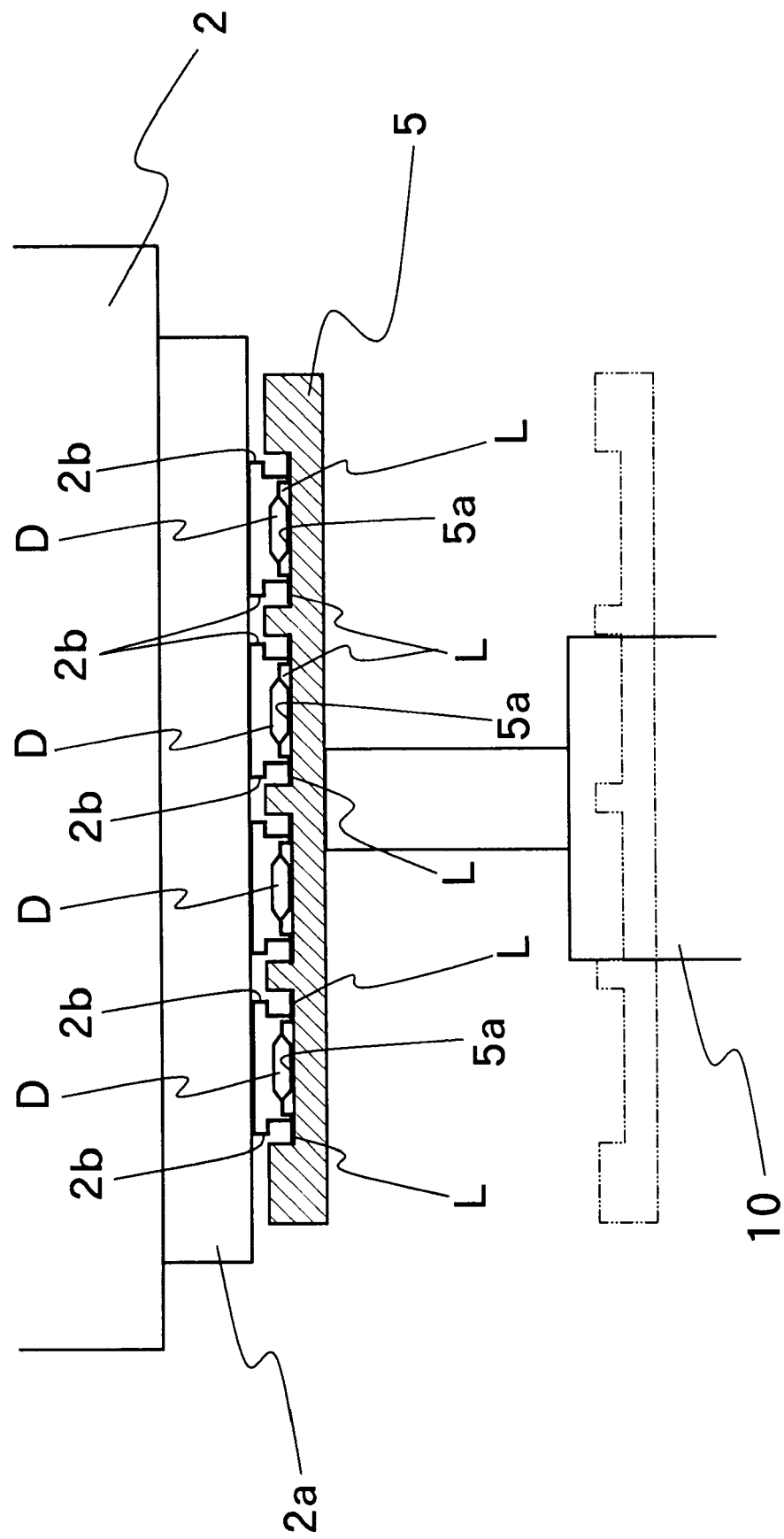
FIG. 5 is a schematic illustration of IC packages set in a testing position relative to a tester head.

The IC packages D which have been transferred and set in position within the holder nests 5a on the tester tray 5 in the above-described manner are then electrically connected to the tester head 2a and simultaneously tested for electrical characteristics as shown in FIG. 5. Namely, in the testing section 2, the tester tray 5 is pushed up toward the tester head 2a by actuating the lifting means 10, which is in the form of a piston-cylinder or the like, to move the tester tray 5 upward from beneath its transfer path. As a result, lead pins L of the respective IC packages D are electrically connected with a large number of contact pins 2b on the tester head 2a to check electrical properties of each IC package D.

In testing IC device packages on an IC tester of the arrangements as described above, the individual IC packages D are transferred from a first tray or storage tray 4 onto a second tray or tester tray 5 in the loading section 1, after a test is finished, they are transferred and relocated again in the unloading section 3 from the second tray or tester tray 5 to a third tray which is of the same arrangement as the storage tray 4.

Figure 6:
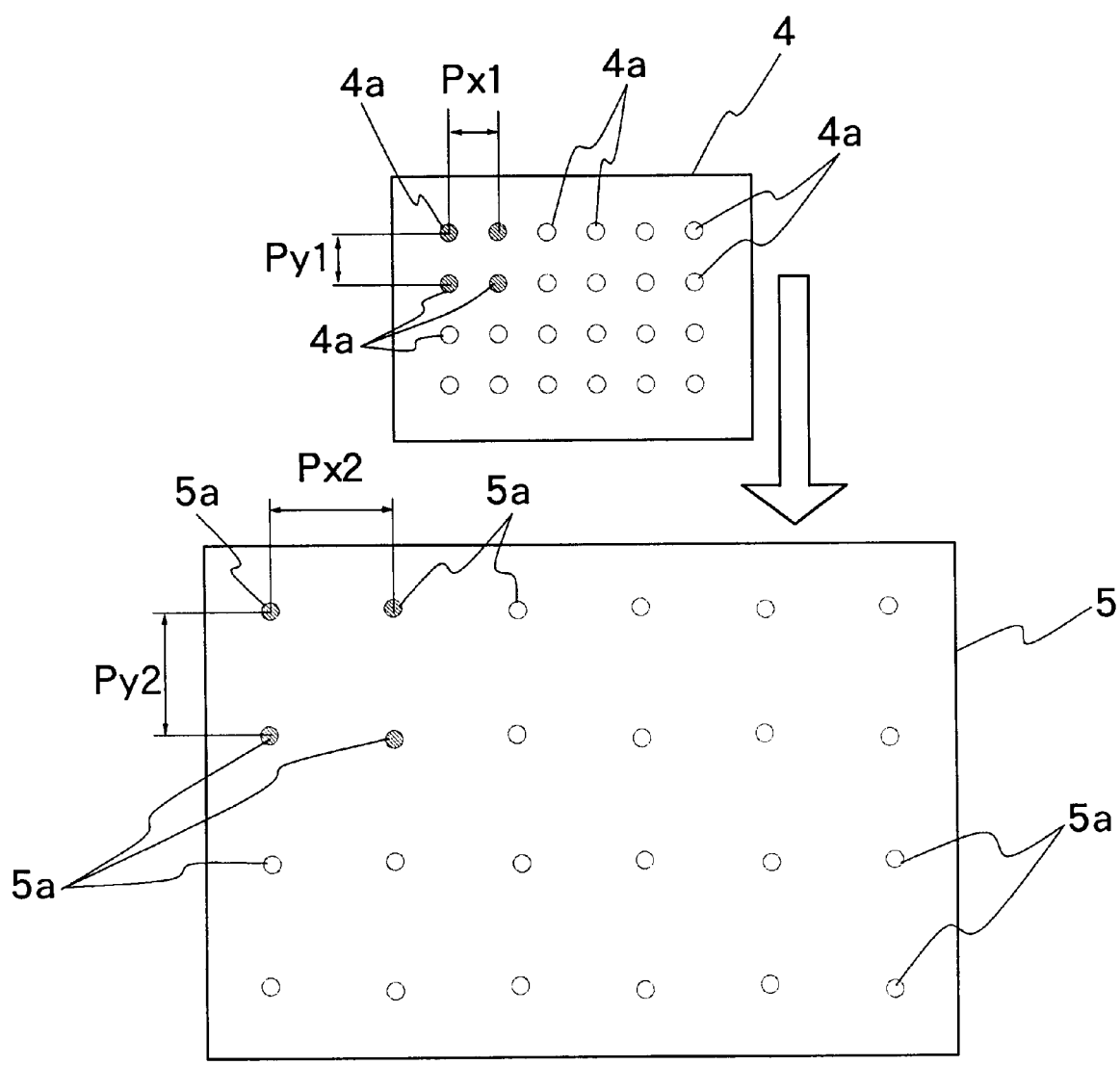
FIG. 6 is a schematic illustration explanatory of a difference in pitch or spacings between IC package holder nest arrays on storage and tester trays.

Of the two types of IC holder trays 4 and 5 each with an array of a large number of IC package holder nests 4a or 5a, the storage tray 4 is arranged in a compact form as shown in FIG. 6, having the respective IC package holder nests 4a at relatively small distances $P_{X1}$ and $P_{Y1}$ from adjacent holder nests 4a in the same row or column. On the other hand, in the case of the tester tray 5 with the positioning protuberances 6 and clamp members 7, the IC package holder nests 5a are arranged at relatively large distances $P_{X2}$ and $P_{Y2}$ from adjacent holder nests 5a in the same row and column. In order to transfer and relocate IC packages efficiently at a higher speed between the IC package holder nests 4a and 5a which are arrayed in different pitches, it is desirable to hand over at least four IC packages D simultaneously from one tray to the other in one cycle of transfer operation.

Figure 7:
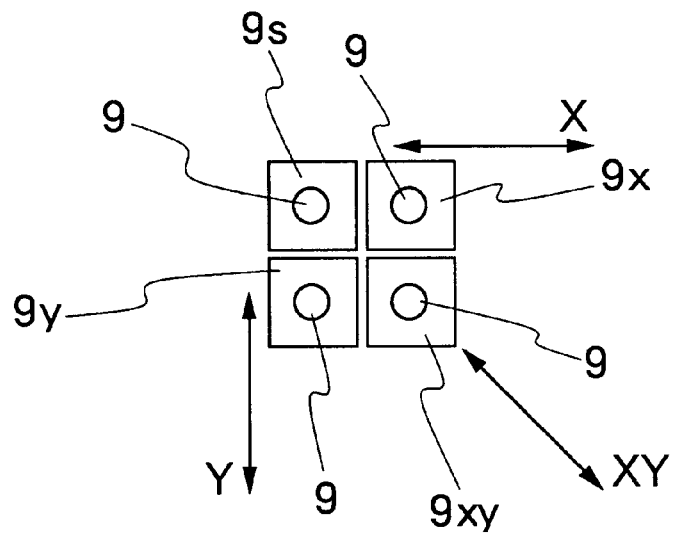
FIG. 7 is a schematic illustration showing a basic construction of a suction gripper assembly.

As described hereinbefore, the IC packages D are transferred by means of the suction gripper 9 which is arranged to grip four IC packages D at one time as shown in FIG. 7. More specifically, the suction gripper 9 is provided with four suction heads which are independently supported on four support blocks 9s, 9x, 9y and 9xy in a regular array of X- and Y-directions. Of these four support blocks, located fixedly in a predetermined reference position is a first support block 9s. Located adjacently to the first support block 9s in the direction X is a second support block 9x which is movable toward and away from the fixed first support block 9s in the direction X in FIG. 7. Located adjacently to the first support block 9s in the direction Y is a third support block 9y which is movable toward and away from the fixed first block 9s in the direction Y or in a direction perpendicular to the direction of movement of the second support block 9x. Further, located diagonally to the fixed first support block 9s is a fourth support block 9xy which is movable toward and away from the fixed first support block 9s in a diagonal direction XY as indicated in FIG. 7.

When the second, third and fourth support blocks 9x, 9y and 9xy are in closed positions in the proximity of the fixed first support block 9s, the four suction heads on these support blocks are located in the same positional relations as four adjacently located IC package holder nests 4a on the storage tray 4. As a consequence, the suction gripper 9 can pick up four IC packages D simultaneously from four IC package holder nests 4a on the storage tray 4. When the suction gripper 9 is spread open by moving the second, third and fourth support blocks 9x, 9y and 9xy are moved away from the fixed first support block 9s in directions X, Y and XY, respectively, the suction heads on the four support blocks are spread apart into the same positional relations as four adjacently located IC package holder nests Sa on the tester tray 5. Accordingly, in this spread state, the suction gripper 9 can transfer four IC packages D simultaneously to and from the IC package holder nests 5a on the tester tray 5.

Figure 8:
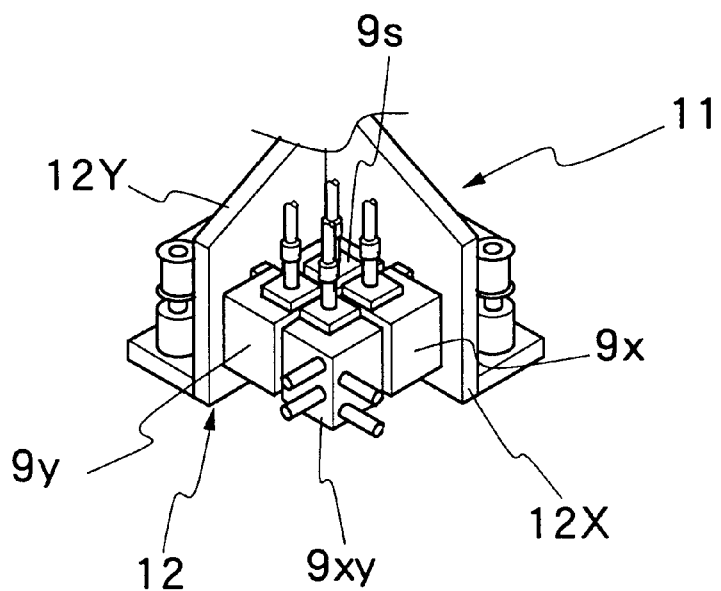
FIG. 8 is a schematic perspective view of the suction gripper assembly.

Illustrated in FIG. 8 is an example of a transfer gripper assembly including drive mechanisms for the movable second, third and fourth support blocks 9x, 9y and 9xy. In that figure, indicated at 11 is a transfer gripper assembly which is mounted on a 3-axis robot arm which is movable in horizontal directions, namely, in the directions of X- and Y-axes in addition to the vertical direction or direction Z, for moving the transfer gripper assembly in horizontal and vertical directions. The construction of the 3-axis robot arm itself is well known in the art and therefore omitted in the drawings for the sake of simplicity of illustration.

Figure 9:
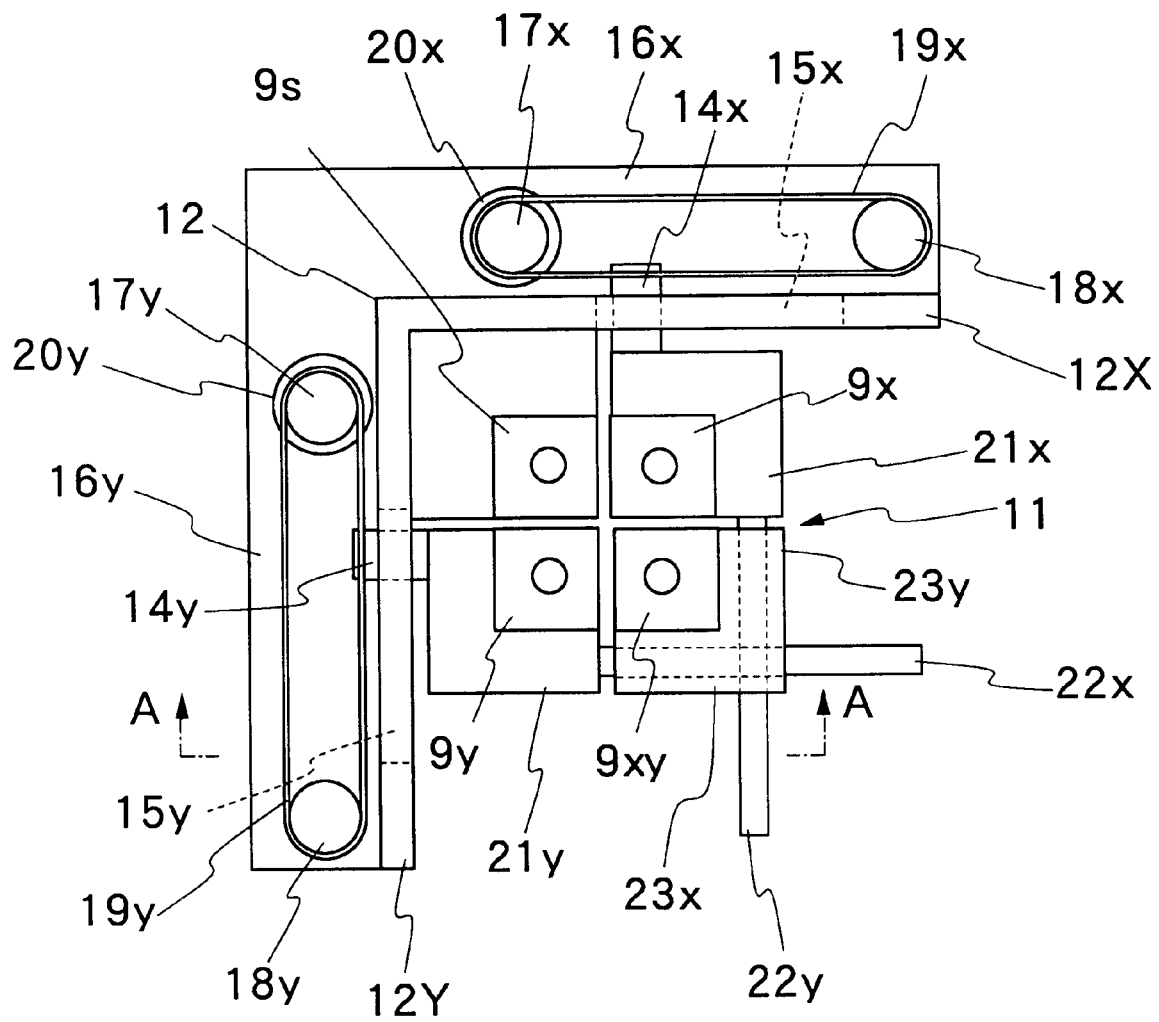
FIG. 9 is a schematic plan view of the suction gripper assembly of FIG. 8.
Figure 10:
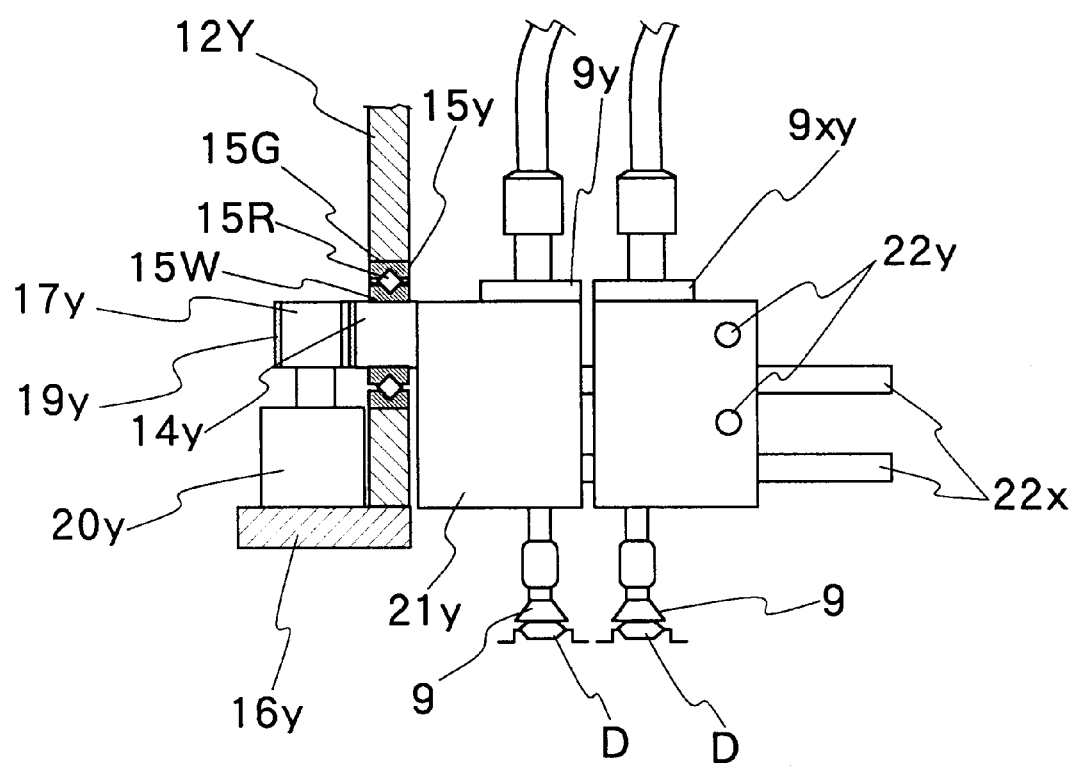
FIG. 10 is a schematic sectional view taken on line A—A of FIG. 9.
Figure 11:
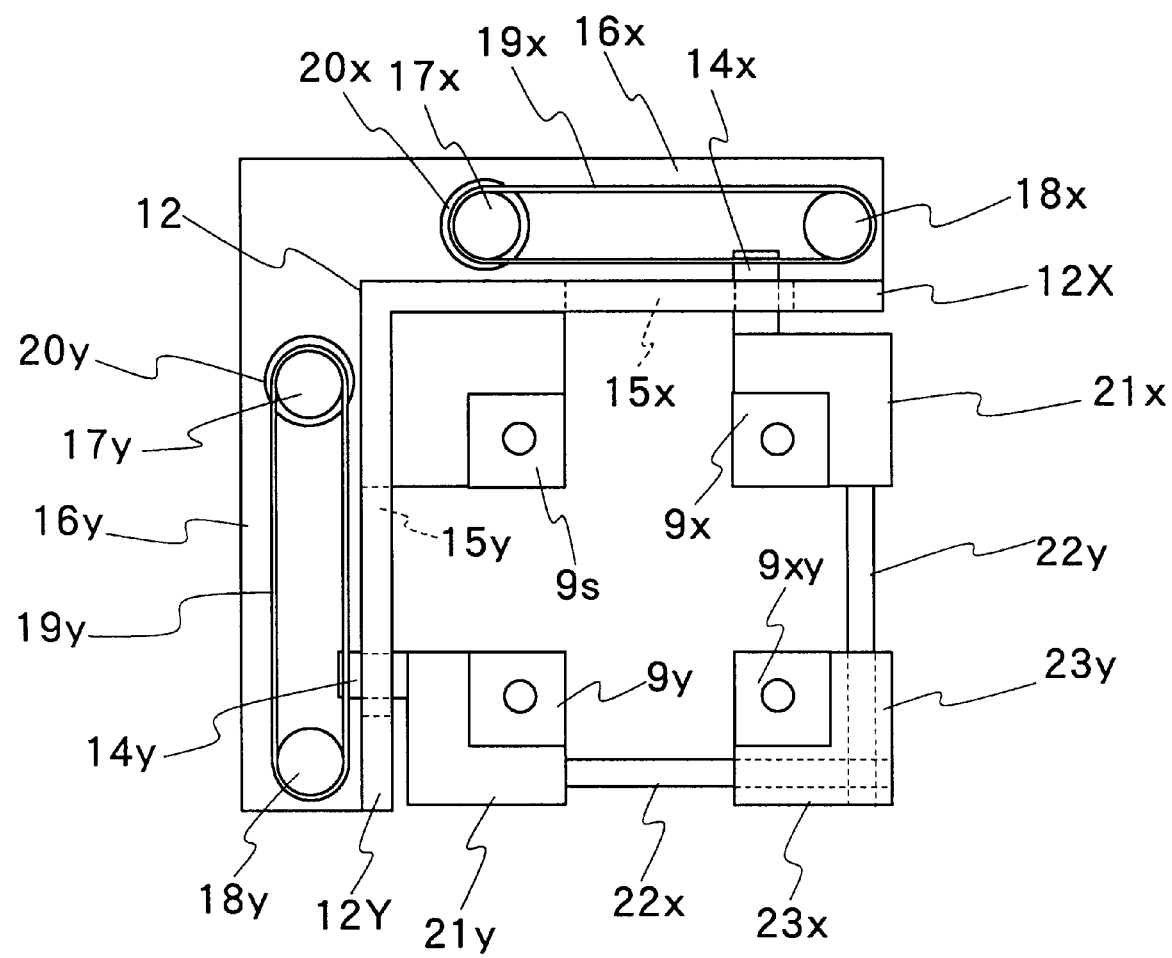
FIG. 11 is a view similar to FIG. 9, but showing support blocks of the suction gripper assembly spread apart into maximally spaced positions.

The transfer gripper assembly 11 includes a mounting plate 12 consisting of first and second mounting plate members 12X and 12Y which are disposed and fixed perpendicularly to each other in the shape of letter L in section. The longer side of the mounting plate 12 is disposed in the vertical direction and vertically movably connected to the robot arm at its upper end. Mounted on the mounting plate 12 are the four support blocks 9s, 9x, 9y and 9xy as shown in FIG. 9. The first support block 9s is mounted fixedly in a corner which is defined between the two mounting plate members 12X and 12Y. The second and third support blocks 9x and 9y are mounted on the mounting plate members 12X and 12Y, respectively, and linearly movable toward and away from the first support block 9s along the faces of the mounting plate members 12X and 12Y. Suspended downwardly at center positions of these support blocks 9s, 9x, 9y and 9xy are the afore-mentioned four suction gripper heads 9.

The second and third support blocks 9x and 9y are connected to slide members 14x and 14y, respectively, which are slidably engaged in guide means 15x and 15y provided on the mounting plates 12X and 12Y, respectively. For instance, the guide means 15x and 15y can be constituted by guide rails 15G extended in and along horizontal slots on the plates 12X and 12Y, and roller ways 15W provided on the part of the slide members 14x and 14y in engagement with the guide rails 15G. By the use of guide means of such arrangements, the second and third support blocks 9x and 9y can be moved horizontally toward and away from the first fixed support block 9s or in X and Y directions, respectively.

In order to drive the second and third support blocks 9x and 9y in X and Y directions, the slide members 14x and 14y are extended through the guide means 15x and 15y on the mounting plate members 12X and 12Y to project on the outer sides of these mounting plate members 12X and 12Y away from the support blocks 9x and 9y, respectively. Provided on the outer sides of the mounting plate members 12X and 12Y are decks 16x and 16y which support thereon X-direction pulleys 17x and 18x and Y-direction pulleys 17y and 18y lapped with belts 19x and 19y, respectively. The pulleys 17x and 17y are connected to and rotationally driven from electric motors 20x and 20y to feed the belts 19x and 19y in the directions of X-and Y-axes. As the belts 19x and 19y are fed in these directions, the slide members 14x and 14y which are connected to the belts 19x and 19y are moved in the directions of X- and Y-axes to shift the positions of the support blocks 9x and 9y, respectively.

The second and third support blocks 9x and 9y are provided with extension blocks 21y and 21x each having a couple of guide rods 22y or 22x extended in a direction perpendicular to the direction of movement of the movable support block 9x or 9y. The guide rods 22y and 22x are slidably passed through bearing portions 23y and 23x on an extension block 9xy of the fourth movable support block 9xy. Therefore, as the second and third support blocks 9x and 9y are moved in the directions of X- and Y-axes, their movements are followed by the fourth support block 9xy to shifts its position in the X and Y directions by the same distances. As a consequence, the position of the fourth support block 9xy is shifted in the diagonal direction relative to the first support block 9s.

Therefore, when the second and third support blocks 9x and 9y are moved toward the respective closed positions in the proximity of the first support block 9s as shown in Fig. 9, the fourth support block 9xy which is interlinked with the second and third support blocks 9x and 9y through the guide rods 22y and 22x is likewise shifted to its closed position. In this closed or contracted state, the mounting plate 12 is lowered toward a storage tray 4 to pick up four IC packages D on the suction gripper heads 9 at one time by vacuum gripping force, followed by uplifting of the mounting plate 12 to lift the gripped IC packages clear of the storage tray 4. On the other hand, when the support blocks 9s, 9x, 9y and 9xy are in the above-described contracted positions, if the motors 20x and 20y are actuated to feed the belts 19x and 19y, the second and third support blocks 9x and 9y are moved away from the first support block 9s in X and Y directions, respectively. Simultaneously, the fourth support block 9xy, which is linked with the second and third support blocks 9x and 9y through the guide rods 22y and 22x, is moved away from the first support block 9s in X and Y directions by the same distances as the second and third support blocks 9x and 9y. As a consequence, the fourth support block 9xy is diagonally shifted away from the first support block 9s to assume a position as shown in FIG. 1. In the spread positions, the support blocks 9s, 9x, 9y and 9xy are spaced apart from each other in the same positional relations as adjacently located IC package holder nests 5a on the tester tray 5. Accordingly, now the suction gripper heads 9 on the support blocks 9s, 9x, 9y and 9xy can place the four IC packages D simultaneously in the IC package holder nests 5a on the tester tray 5, which are arranged in a relatively broadly spaced array as explained hereinbefore. In this instance, the second and third support blocks 9x and 9y may be shifted into the respective spread positions simultaneously or one after another.

Thus, the support blocks 9s, 9x, 9y and 9xy of the suction gripper heads 9 are held in the above-described spread positions, for example, at the time of picking up four IC packages simultaneously from the tester tray 5, and folded into the contracted or closed positions at the time of handing over four IC packages D simultaneously onto a storage tray 4 which has the IC package holder nests in a relatively narrowly spaced array.

The spacings between the support blocks 9s, 9x, 9y and 9xy can be changed while the transfer gripper assembly is in movement toward or away from the tester tray 5 during an IC loading or unloading operation. Accordingly, when transferring a large number of IC packages D between two IC holder trays which have IC package holder nests arranged in differently spaced arrays, the transfer speed and efficiency can be enhanced to a significant degree by the use of the above transfer gripper assembly which can pick up four IC packages simultaneously on its four suction heads and which can adjust the spacings between the gripper heads into conformity with spacings of arrayed IC package holder nests on a tray to be accessed by the transfer gripper assembly.

Besides, of the four support blocks 9s, 9x, 9y and 9xy of the suction heads 9, it is only the two support blocks 9x and 9y which need to be driven to shift all the movable support blocks of the gripper assembly into spread positions including the support block 9xy. Therefore, the drive mechanisms for the movable support blocks can be of extremely simple arrangements. In this regard, the drive mechanisms employing the motors 20x and 20y in combination with the belts 19x and 19y have an advantage in that the movable support blocks can be stopped at arbitrary positions or in arbitrarily spaced positions, and as a consequence they can cope with not only transfer operations between two different types of trays but also transfer operations among more than two types of trays with IC package holder nests or the like in differently spaced arrays.

What is claimed is:

1. An adjustable gripper mechanism, comprising:
   a movable suction gripper assembly having four suction heads mounted separately on four support blocks on a mounting element;

said four support blocks including:
- a first support block independently supported in a predetermined reference position on said mounting element, second and third support blocks movably supported on said mounting element for movements toward and away from said first support block in perpendicularly intersecting directions, and
- a fourth support block slidably supported on guide members extended out from said second and third support blocks in directions perpendicular to the directions of movements of said second and third support members and arranged to be moved toward and away from said first support block in a diagonal direction following movement of at least one of said second and third support blocks.

2. The adjustable gripper mechanism as defined in claim 1, wherein said first support block is fixedly mounted on said mounting plate in a corner portion defined between a couple of vertical guide walls of said mounting plate joined at right angles with each other, and said second and third support blocks are driven from a drive mechanism to shift the respective positions toward and away from said first support block along surfaces of said vertical guide walls, simultaneously shifting the position of said fourth support block along guide rods projecting from said second and third support blocks in perpendicularly intersecting directions.

3. The adjustable gripper mechanism as defined in claim 2, wherein said second and third support blocks are connected to separate a drive mechanism for movements independently of each other.

4. The adjustable gripper mechanism as defined in claim 2, wherein said second and third support blocks are connected to belt and pulley drive mechanisms arranged to stop said support blocks in arbitrary positions within respective predetermined displacement ranges.

5. The adjustable gripper mechanism as defined in claim 3, wherein said second and third support blocks are connected to belt and pulley drive mechanisms arranged to stop said support blocks in arbitrary positions within respective predetermined displacement ranges.

6. A gripper assembly, comprising:
- an L-shaped mounting plate;
- a first member fixedly mounted within a corner portion of said L-shaped mounting plate;
- a second member movably supported on said L-shaped mounting plate and disposed adjacent to said first member;
- a third member movably supported on said L-shaped mounting plate and disposed adjacent to said first member; and
- a fourth member movably supported on said L-shaped mounting plate and disposed diagonally adjacent to said first member,
- wherein the second member and the third member include a guide rod connecting said fourth member so as to move the fourth member in synchronization with movements of at least one of said second member and said third member.

7. The assembly as defined in claim 6, further comprising first and second drive mechanisms configured to respectively move the second member and the third member toward and away from the first member.

8. The assembly as defined in claim 6, wherein the first, second, third and fourth members include a suction head to grasp an object.

9. The adjustable gripper mechanism as defined in claim 1, wherein the movable suction gripper assembly transfers molded IC packages to and from a first tray having thereon a plural number of IC package holder nests in a relatively narrowly spaced array and a second tray having thereon a plural number of IC package holder nests in a relatively widely spaced array.

* * * * *